United States Patent [19]

Spence

[11] 4,268,807
[45] May 19, 1981

[54] BAND-PASS FILTER AND GAIN STAGE

[76] Inventor: Lewis C. Spence, 948 Avenue East, Rivera Beach, Fla. 33404

[21] Appl. No.: 924,317

[22] Filed: Jul. 13, 1978

[51] Int. Cl.³ .................... H03H 9/56; H03H 9/52; H03H 11/04
[52] U.S. Cl. .................................. 333/191; 330/174; 333/189
[58] Field of Search ............ 333/187, 189, 191, 192, 333/18; 325/477, 489; 330/306, 302, 305, 174; 310/317–319, 320–321, 365, 366; 455/296, 339

[56] References Cited

U.S. PATENT DOCUMENTS

| | | | |
|---|---|---|---|
| 3,319,193 | 5/1967 | Barnett | 333/187 |
| 3,569,873 | 3/1971 | Beaver | 333/18 X |
| 4,023,112 | 5/1977 | Duncker et al. | 330/306 |

Primary Examiner—Marvin L. Nussbaum
Attorney, Agent, or Firm—Saidman & Sterne

[57] ABSTRACT

A band-pass filter and gain stage which produces a desired passband at a preselected center frequency. The present invention can be characterized as being a very passive frequency door whose output is lightly coupled to a broad band frequency amplifier having a high gain. The present invention includes an input connected to an input impedance stage, which is connected to a monolithic filter stage, which is connected to a second impedance stage, which is connected to a gain stage, which, in turn, is connected to an output terminal. A piezoelectric quartz crystal monolithic filter or a piezoelectric ceramic monolithic filter can be employed depending on the width desired for the passband response.

27 Claims, 3 Drawing Figures

BAND-PASS FILTER AND GAIN STAGE

BACKGROUND OF THE INVENTION

1. Field of Use

The present invention relates to electrical band-pass filters.

2. Prior Art

Electrical band-pass filters which exhibit a narrow passband centered on a preselected center frequency and sharp skirts have been known in the art for several decades. Good technical discussions of prior art electrical band-pass filter design theory and apparatus can be found in many standard texts, including: *Reference Data for Radio Engineers*, 6th edition, Howard W. Sams & Co., Inc., Indianapolis, Ind., 1975, Chapters 7–10; *Single Sideband for the Radio Amateur*, 5th edition, American Radio Relay League, Inc., Newington, Conn., 1970; *The Radio Amateur's Handbook*, 57th edition, American Radio Relay League, Inc., Newington, Conn., 1978.

Various approaches have been used to attempt to achieve the various passband characteristics needed in present-day sophisticated communications systems and the like: narrow passband response centered on a preselected center frequency; sharp skirts down to 50 dB or more; very low ripple in the passband; low inter-modulation distortion; high frequency stability with respect to temperature; low passband insertion loss; high isolation between the input and the output; etc.

One approach has been the high-frequency crystal band-pass filter. Piezoelectric quartz crystals are used as the filter elements because of their very high Q values. Examples of such filters can be found in the references listed above.

Such high-frequency crystal band-pass filters, while producing some of the desired passband characteristics, nevertheless, exhibit many major deficiencies. For example, fabrication of such filters is both complicated and costly because each of the crystals must be checked and often modified before being put into the filter assembly in order to obtain satisfactory performance. While a narrow passband response can typically be achieved at a 3 dB down point using only a few crystals, many crystals are required to produce sharp skirts down to 50 dB or more. It is also very difficult to remove ripple in the passband because each crystal has its own electrical pole. Low inter-modulation distortion is very difficult to achieve because frequency-sensitive elements, such as inductors and capacitors, must be used in the filter assembly. High-frequency stability with respect to temperature is difficult to achieve because many of the required components are temperature sensitive. The required use of several crystals and associated components to produce a filter having a sharp passband and fairly sharp skirts necessarily results in a higher passband insertion loss. High isolation between the input and the output of the filter is difficult to achieve because of the high degree of coupling between various filter components. These and other deficiencies limit the usefulness of prior art high frequency crystal band-pass filters.

The ever-expanding use and concomitant crowding of the electromagnetic spectrum has generated an enormous need for technically better and less expensive high-frequency band-pass filters. Another approach other than the high-frequency band-pass filter has been the active filter. Technical discussions of such active filters can be found in the references listed above. Active filters, however, also exhibit many deficiencies.

SUMMARY OF THE INVENTION

It is an object of the present invention to produce a band-pass filter and gain stage which is both easy and inexpensive to fabricate and maintain It is another object of the present invention to provide a band-pass filter and gain stage which produces a passband of desired frequency width which is centered on a preselected center frequency.

It is a further object of the present invention to provide a band-pass filter and gain stage which produces a passband having very sharp skirts.

It is another object of the present invention to provide a band-pass filter and gain stage which produces a passband having very low ripple.

It is a further object of the present invention to provide a band-pass filter and gain stage which produces a passband having very low inter-modulation distortion.

It is a further object of the present invention to provide a band-pass filter and gain stage which exhibits a very high adjacent channel rejection response.

It is another object of the present invention to provide a band-pass filter and gain stage which produces a passband response which is not affected by a change in temperature.

It is another object of the present invention to provide a band-pass filter and gain stage which exhibits a high isolation between the input and the output.

These and additional objects are achieved by the band-pass filter and gain stage of the present invention.

The present invention can be characterized as being a very passive frequency door whose output is lightly coupled to a broad band frequency amplifier having a high gain. The present invention includes an input connected to an input impedance stage, which is connected to a monolithic filter stage, which is connected to a second impedance stage, which is connected to a gain stage, which, in turn, is connected to an output terminal. A piezoelectric quartz crystal monolithic filter or a piezoelectric ceramic monolithic filter can be employed depending on the width desired for the passband response.

DETAILED DESCRIPTION OF THE PREFERRED EMBODIMENTS

Figure 1:
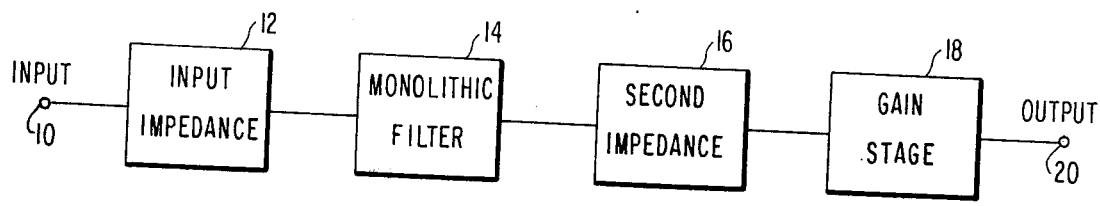
FIG. 1 is a block diagram of the bandpass filter and gain stage of the present invention.

Referring now to FIG. 1, the functional blocks of the band-pass filter and gain stage of the present invention are shown and are characterized as being an input terminal 10 connected to an input impedance stage 12, which is connected to a monolithic filter stage 14, which is connected to a second impedance stage 16, which is connected to a gain stage 18, which, in turn, is connected to an output terminal 20.

As will become more apparent by the technical explanation presented below, the present invention can be viewed as being a very passive frequency door whose output is lightly coupled to a broad band frequency amplifier having a high gain—i.e., more than 20 dB at the center frequency of the passband. The very passive frequency door only passes those input signals whose frequencies fall within the "door" or passband, and substantially attenuates all signals outside the "door" or passband, including those that are very near in frequency to the "door" or passband. The frequency door includes the input impedance 12, the monolithic filter 14 and the second impedance 16. Because the input signals which pass through the "door" or passband are substantially attenuated, e.g., 15 dB is typical, the gain stage 18 brings these signals back up to a desired output level.

The heart of the very passive frequency door is the monolithic filter 14. The monolithic filter 14 can be characterized as a single mechanical package which contains two electrical filter elements. One of the electrical filter elements has a pole which is displaced in a positive increment from the center frequency of the passband, and the other electrical filter element has a pole which is displaced a negative increment from the center frequency of the passband. The absolute values of the positive and negative increments are substantially equal, and their absolute value sum approximately equals the width of the passband at the 3 dB down point. One side of each of the two electrical filter elements is connected to a common ground.

As is stated in greater detail below, there are many commercial available units which are suitable for the monolithic filter 14. One group of commercially available units employ peizoelectric quartz crystal electrical filter elements. Such piezoelectric quartz monolithic filter units are particularly useful when a passband having a width in the range of 10–40 KHz at 3 dB down and a center frequency of 10.7 MHz is desired. Such piezoelectric quartz monolithic filter units exhibit a very high Q, a high resistance outside the passband and a relatively low resistance (e.g., 600 ohms) within the passband.

A second group of commercially available units employ ceramic piezoelectric electrical filter elements. Such piezoelectric ceramic monolithic filter units are particularly useful when a passband having a width in the range of greater than 40 KHz at 3 dB down and a center frequency of 10.7 MHz is desired. Such piezoelectric ceramic monolithic filter units exhibit a very high Q, a high resistance outside the passband and a relatively low resistance (e.g., 200 ohms) within the passband.

As shown in FIG. 1, the input impedance stage 12 provides the input electrical signal (not shown) applied to input terminal 10 to one of the piezoelectric electric filter elements of the monolithic filter stage 14. It has been found that it does not matter whether the input impedance stage 12 is connected to the piezoelectric electric filter element of monolithic filter stage 14 having the pole in a positive increment from the center frequency or to the filter element having the pole in a negative increment from the center frequency.

The input impedance stage 12 electrically couples the electrical signal at terminal 10 to the monolithic filter stage 14 using a substantially pure electrical resistance which does not have any appreciable capacitive or inductive components. Thus, the coupling provided by the input impedance stage 12 between the input signal at input terminal 10 and the monolithic filter stage 14 is substantially frequency insensitive.

It has been found that the level of coupling provided by input impedance stage 12 is very important in order to achieve the desired passband response. For example, it has been found that if too little of the input electrical signal at input terminal 10 is provided by the input impedance stage 12 to the monolithic filter stage 14, then the passband response produced is one that is not optimum because it is "bell-shaped": the skirts are not sharp in the region from 0–3 dB down, and the passband is not flat between the 0 dB points.

At the other extreme, it has been found that if too much of the input electrical signal at input terminal 10 is provided by the input impedance stage 12 to the monolithic filter stage, then the resultant passband response is also not optimum because the skirts are not steep, etc.

Instead, it has been found that the proper level of coupling is when input impedance stage 12 is a substantially pure resistance element in the range between 200–2200 ohms. The explanation for this range is that monolithic filter element 14 exhibits a very high resistance to signals whose frequency is outside the passband, but exhibits a low resistance to signals whose frequency is within the passband. Thus, because the input impedance stage 12 is in series electrical connection with the monolithic filter element 14, those signals whose frequency is outside the passband are substantially attenuated in the input impedance stage 12, while those signals whose frequency is inside the passband are coupled to the monolithic filter element 14. However, the amount of coupling by the input impedance stage 12 of those signals whose frequency is within the passband is limited because of the resistance value of input impedance stage 12.

As shown in FIG. 1, the other one of the two piezoelectric filter elements of the monolithic filter stage 14 is in series connection with the second impedance stage 16. The second impedance stage is a substantially pure electrical resistance that does not have any appreciable capacitive or inductive components. Thus, the coupling between the monolithic filter element 14 and the second impedance stage 16 is substantially frequency insensitive.

It also has been found that the level of coupling between the monolithic filter stage 14 and the second impedance stage 16 is very important in order to achieve the desired passband response. It has been found that too low or too high a level of coupling produces a passband response that is not the optimum one.

It has been found that the proper level of coupling between the monolithic filter stage 14 and the second impedance stage 16 is when the second impedance stage 16 is a substantially pure resistance element in the range between 200–2200 ohms. It is believed that this range is due to the fact that the monolithic filter stage 14 exhibits a very high resistance to signals whose frequency is outside the passband but also exhibits a low resistance to signals whose frequency is within the passband. Thus, since the monolithic filter element 14 is in series connection with the second impedance stage 16, those signals from input terminal 10 whose frequency is outside the passband are very substantially attenuated before they are provided by the monolithic filter stage 14 to the second impedance stage 16. On the other hand, those signals from the input terminal 10 whose frequency is inside the passband are passed by the monolithic filter stage 14 to the second impedance stage 16 with only a low level of attenuation: the attenuation introduced by the series-connected resistances of input impedance stage 12, second impedance stage 16 and the monolithic filter stage 14.

It is now apparent why the combination of input terminal 10, input impedance stage 12, monolithic filter stage 14 and second impedance stage 16 can be viewed as being a very passive frequency door. Because of the level of coupling used between input impedance stage 12 and monolithic filter stage 14 and between monolithic filter stage 14 and second impedance stage 16, those input signals whose frequency is outside the passband are effectively blocked, while those input signals whose frequency is within the passband are passed with moderate attenuation.

As shown in FIG. 1, the second impedance stage 16 is in series electrical connection with the gain stage 18. Gain stage 18 has a wide-band frequency characteristic especially in the range around the center frequency of the passband. It has an input impedance which is substantially a pure resistance without any appreciable inductive or capacitive components and which has an ohmic value less than or equal to the resistance value of the second impedance stage 16. In addition, gain stage 18 has an output impedance which is substantially a pure resistance without any appreciable inductive or capacitive components and which has an ohmic value equal to or greater than the resistance value of the input impedance stage 12.

Because the resistance value of the input of gain stage 18 is equal to or less than the resistance value of the second impedance stage 16, the coupling between the second impedance stage 16 and the gain stage 18 becomes less as the input impedance of the gain stage 18 is lowered. It has been found that optimum passband response is achieved when the input impedance of gain stage 18 is less than one-half of the second impedance stage 16.

Gain stage 18 must produce a gain in excess of 20 dB in the frequency range of the passband of the filter. Because the input signals whose frequency fall within passband are attenuated approximately 15 dB due to the light coupling between input impedance stage 12, monolithic filter stage 14, second impedance stage 16 and gain stage 18, these signals appear at output terminal 20 at a signal level which is slightly greater than their level at input terminal 10.

As is discussed in the examples which follow, the passband filter and gain stage of the present invention produces a passband response that is outstanding. For example, the passband produced has no measurable ripple and has skirts which are practically vertical down to 120 dB or more. Inter-modulation distortion is practically non-existent because all couplings use purely resistive elements which are frequency insensitive due to the absence of capacitive and inductive components. Very high adjacent channel rejection is observed. Moreover, very high isolation is possible without having to resort to careful shielding or layout. The passband response is not affected by changes in temperature. The filter is very easy to fabricate and maintain, and does not require that the monolithic filter stage 14 be modified to achieve the desired filter response.

It is believed that one of the major reasons for the outstanding performance of the present invention is due to the light resistive coupling between stages. By not coupling the input signal too heavily to the monolithic filter stage 14 and by not coupling the monolithic filter stage 14 too heavily to the gain stage 18, it is believed that this permits the monolithic filter stage to act as a very passive frequency door which passes only those signals having a frequency within the passband.

It is believed that the use of light couplings between the filter elements has not been recognized in the past because it results in appreciable attenuation to those signals whose frequency are within the passband, e.g., 15 dB is typical. In the past, signal gain was the standard goal in communication design, and attenuation of desired signal was not considered to be good design practice. This has changed recently, however, with the appearance of inexpensive and commercially available solid-state devices that exhibit high amplification factors at high frequencies.

It should be noted that several of the passband filter and gain stages of the present invention can be connected in series to produce an ever-more optimum passband response.

It should also be understood that the passband filter and gain stages of the present invention can be fabricated on a chip or the like using conventional semiconductor integrated circuit fabrication techniques.

EXAMPLE 1

Figure 2:
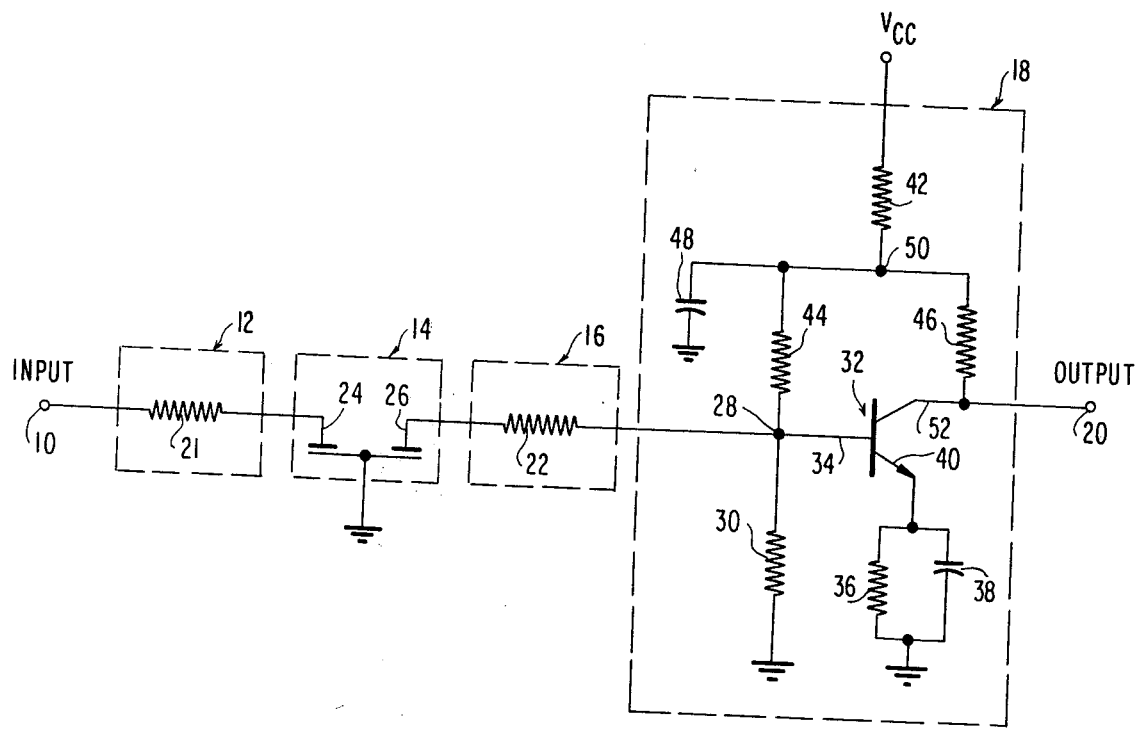
FIG. 2 is a circuit block diagram of the preferred embodiment of the present invention, which employs a piezoelectric quartz crystal monolithic filter.

Referring to FIG. 2, an embodiment of the present invention which employs a piezoelectric quartz crystal electrical filter for the monolithic filter stage 14 is shown. Like reference numerals refer to like stages in FIGS. 1 and 2.

The input impedance stage 12 includes a resistor 21. Resistor 21 should exhibit a substantially pure resistance in the range of 200–2200 ohms. The first end of resistor 21 is connected to the input terminal 10, and the second end is connected to one of the two piezoelectric quartz crystal electrical filter elements of the monolithic filter stage 14. As is stated above, it has been found that it does not matter whether the second end of resistor 21 is connected to the piezoelectric quartz crystal electrical filter element having the pole in the positive increment from the center frequency or the electrical filter element having the pole in the negative increment from the center frequency. For purposes of explanation, the second end of resistor 21 is said to be connected to electrical filter element 24.

Suitable piezoelectric quartz crystal monolithic filter units for the monolithic filter stage 14 are commercially available from many different sources, including Tama, Inc. of Kawaski, Japan. As is stated above, such piezoelectric quartz crystal monolithic filter units are particularly useful when a passband having a width in the range of 10–40 KHz at 3 dB down and a center frequency of 10.7 MHz is desired.

The second impedance stage 16 includes a resistor 22. Resistor 22 should exhibit a substantially pure resistance in the range of 200–2200 ohms. The first end of resistor 22 is connected to the other one of the two piezoelectric quartz crystal electrical filter element, designated as electrical filter element 26.

Node 28 constitutes the input of the gain stage 18. The second end of resistor 22 is connected to node 28.

Gain stage 18 exhibits a broad band frequency response characteristic, especially in the frequency range around the center frequency of the desired passband, and also produces a high gain of 20 dB or greater. It is desirable that gain stage 18 have an input impedance that is substantially a pure resistance that is of an ohmic value equal to or less than the value of resistor 22, and that gain stage 18 have an output impedance that is substantially a pure resistance that is of an ohmic value equal to or greater than the value of resistor 21. Gain stage 18 should also be designed to be insensitive to temperature changes. It is apparent that many different amplifier designs will produce the desired characteristics.

As shown in FIG. 2, a resistor 30 is connected between node 28 and ground, and the base 34 of a transistor 32 is also connected to node 28. A resistor 36 and a capacitor 38 in series connection are connected between the emitter 40 of transistor 32 and ground. The voltage supply $V_{cc}$ (not shown) for gain stage 18 is connected to one end of a resistor 42, whose second end is connected to node 50. One end of a capacitor 48 is connected to node 50, and its second end is connected to ground. One end of a resistor 44 is also connected to node 50, and the second end is connected to node 28. One end of a resistor 46 is also connected to node 50, and the second end is connected to the collector 50 of transistor 32. The collector 52 is also connected to the output terminal 20.

A passband filter and gain stage of the present invention was designed and constructed to achieve a passband of 14 KHz and a center frequency of 10.7 MHz according to the circuit of FIG. 2 using the component values of Table 1 shown below.

TABLE 1

| Resistor 21 | 1,800 Ω ⅛ watt |
|---|---|
| Monolithic Filter 4 | 2 piezoelectric quartz crystal electrical elements in one mechanical casing with poles ± 7 KHz at 10.7 MHz |
| Resistor 22 | 1,800 Ω ⅛ watt |
| Resistor 30 | 10,000 Ω ⅛ watt |
| Transistor 32 | 2N5134 NPN silicon |
| Resistor 36 | 2,000 Ω ⅛ watt |
| Capacitor 38 | .001 μfd ceramic |
| Resistor 42 | 100 Ω ⅛ watt |
| Resistor 44 | 47,000 Ω ⅛ watt |
| Resistor 46 | 10,000 Ω ⅛ watt |
| Capacitor 48 | .001 μfd ceramic |

Figure 3:
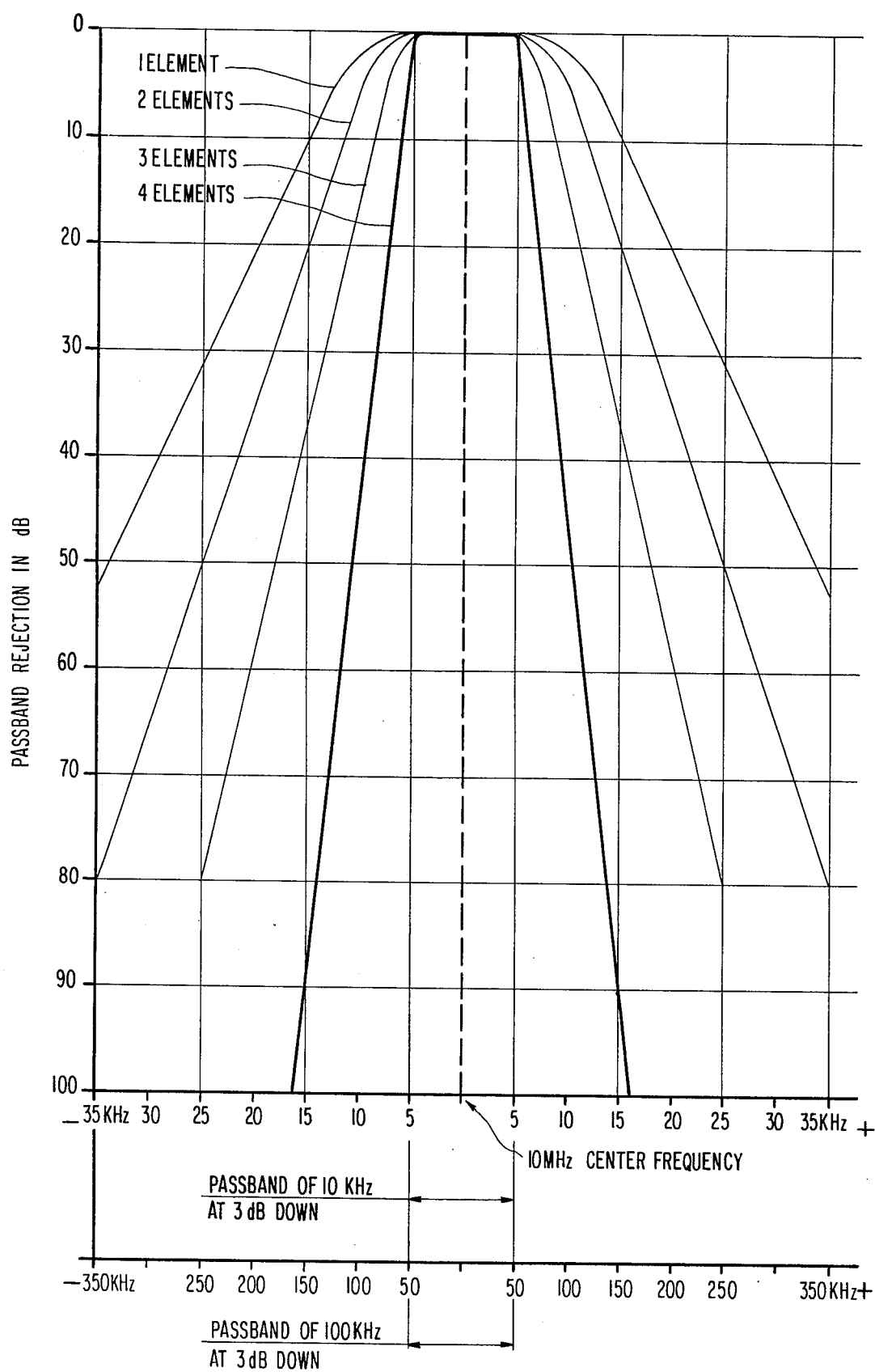
FIG. 3 is a plot of the passband response produced by the filter of FIG. 2, where the horizontal axis plots frequency in KHz on either side of the center frequency and the vertical axis plots band-pass rejection in dB.

A filter and gain stage of the present invention employing the component values of Table 1 was constructed using a straightforward circuit board layout without any attempt to shield or electrically isolate any of the individual components. Using a voltage supply $V_{cc}$ in the range of 10–13.5 volts, the passband response as shown in FIG. 3 was measured using a H.P. 140 T spectrum analyzer with a 100-cycle bandwidth and a 1 KHz division sweep. The horizontal axis of FIG. 3 plots frequency in KHz on either side of the center frequency, and the vertical axis plots passband rejection in dB.

As FIG. 3 illustrates, the measured passband response was outstanding. Specifically, it should be noted that the skirts are almost vertical down to 120 dB and more, and there is no measurable ripple in the passband. Intermodulation distortion was negligible. Extreme isolation between the input 10 and output 20 was observed without special shielding, and very high rejection of adjacent channel signals as close as 25 KHz was also observed. Moreover, the embodiment was unaffected by changes of the voltage $V_{cc}$ in the range given above, and was also unaffected by temperature changes. In addition, the output signal was 10 dB higher than the level of the input signal. Finally, it should be noted that all of the possible components were 10% tolerance units, and no adjustment of the monolithic filter 14 was made.

A better band-pass response has been obtained by connecting in series several of the band-pass filter and gain stages of the present invention. FIG. 3 shows the response characteristics of 2, 3 and 4 units.

EXAMPLE 2

A second example of the preferred embodiment of the invention using the same circuit of FIG. 2 will now be discussed. The actual component values and passband performance will be presented.

Suitable piezoelectric ceramic monolithic filter units for the monolithic filter stage 14 are commercially available from many different sources, including Murata, Inc. of Japan. As is stated above, such piezoelectric ceramic monolithic filter units are particularly useful when a passband having a width of 40 KHz or more at 3 dB down and a center frequency of 10.7 MHz is desired.

A passband and gain stage of the present invention was designed and constructed to achieve a passband of 200 KHz and a center frequency of 10.7 MHz according to the circuit of FIG. 2 using the component values of Table 2 shown below.

TABLE 2

| Resistor 21 | 500 Ω ⅛ watt |
|---|---|
| Monolithic filter 14 | 2 piezoelectric ceramic electrical elements in one mechanical casing with poles ± 100 KHz at 10.7 MHz |
| Resistor 22 | 500 Ω ⅛ watt |
| Resistor 30 | 10,000 Ω ⅛ watt |
| Transistor 32 | 2N5134 NPN silicon |
| Resistor 36 | 2,000 Ω ⅛ watt |
| Capacitor 38 | .001 μfd ceramic |
| Resistor 42 | 100 Ω ⅛ watt |
| Resistor 44 | 47,000 Ω ⅛ watt |
| Resistor 46 | 10,000 Ω ⅛ watt |
| Capacitor 48 | .001 μfd ceramic |

The filter and gain stage of the present invention employing the component values of Table 2 was constructed using a straightforward circuit band layout without any attempt to shield or electrically isolate any of the individual components. Using a voltage supply $V_{cc}$ in the range of 10–13.5 volts, the passband response as shown in FIG. 3 using the lower X-axis scale was measured using a H.P. 140 T spectrum analyzer with a 100-cycle bandwidth and a 1 KHz division sweep. The horizontal axis lower scale of FIG. 3 plots frequency in KHz on either side of the center frequency, and the vertical axis plots passband rejection in dB.

As FIG. 3 illustrates, the measured passband response was outstanding. Specifically, it should be noted that the skirts are almost vertical down to 120 dB and more, and there is no measurable ripple in the passband. Intermodulation distortion was negligible. Extreme isolation between the input 10 and the output 20 was observed without special shielding, and very high rejection of adjacent channel signals as close as 25 KHz was also observed. Moreover, the embodiment was unaffected by changes of the voltage $V_{cc}$ in the range given above, and was also unaffected by temperature changes. In addition, the output signal was 10 dB higher than the level of the input signal. Finally, it should be noted that all of the passive components were 10% tolerance units, and no adjustment of the monolithic filter 14 was made.

An even better passband response has been obtained by connecting in series several of the band-pass filter and gain stages of the present invention.

Although the invention has been described as constructed using integrated circuit technology, other techniques may be employed. For example, hybrid integrated circuits using active and passive components on a chip can be employed. In such a case, the monolithic elements would remain discrete components. Alternatively, using total hybrid technology, the entire device, including monolithic elements, can be placed on a chip.

It is apparent that various modifications and variations can be made without departing from the scope of this invention.

What is claimed is:

1. A band-pass filter and gain stage comprising:
   (a) a monolithic filter having a first filter element and a second filter element, said first and second filter elements being connected to have a common ground;
   (b) a first resistor having a first end and a second end and having a substantially pure resistance value selected from the range of 200–2200 ohms, said first end being connected to said first filter element;
   (c) a second resistor having a first end and a second end and having a substantially pure resistance value selected from the range of 200–2200 ohms, said first end being connected to said second filter element; and
   (d) gain stage means having an input connected to said second end of said second resistor for amplifying an input signal from said second end an amount greater than 20 dB.

2. A band-pass filter and gain stage as recited in claim 1 wherein said gain stage means has an input impedance which is substantially a pure resistance and which has a value substantially less than the value of said second resistor.

3. A band-pass filter and gain stage as recited in claim 1 wherein said gain stage means has an output impedance which is substantially a pure resistance and which has a value equal to or greater than the value of said first resistor.

4. A band-pass filter and gain stage as recited in claim 1 wherein said values of said first and second resistors are approximately equal.

5. A band-pass filter and gain stage as recited in claim 1 wherein said first and second filter elements of said monolithic filter each employ a piezoelectric quartz crystal material.

6. A band-pass filter and gain stage as recited in claim 1 wherein said first and second filter elements of said monolithic filter each employ a piezoelectric ceramic material.

7. A band-pass filter and gain stage as recited in claim 1 for producing a desired passband response at a preselected center frequency, wherein the resonant frequency of said first filter element and the resonant frequency of said second filter element are selected to be on opposite sides but separated an equal amount from said preselected center frequency.

8. A band-pass filter and gain stage as recited in claim 7 wherein the frequency difference between said resonant frequency of said first filter element and said resonant frequency of said second filter element substantially defines said desired passband response.

9. A band-pass filter and gain stage for producing a desired passband response at a preselected center frequency, said band-pass filter and gain stage comprising:
   (a) a monolithic filter having a first filter element and a second filter element, said first and second filter elements each employing a piezoelectric quartz crystal material and being connected together to have a common ground, the resonant frequency of said first filter element and the resonant frequency of said second filter element being selected to be on opposite sides but separated an approximately equal amount from said preselected center frequency, the frequency difference between said resonant frequency of said first filter element and said resonant frequency of said second filter element substantially defining said desired passband response;
   (b) a first resistor having a first end and a second end and having a substanially pure resistance value selected from the range of 1500–2200 ohms, said first end being connected to said first filter element;
   (c) a second resistor having a first end and a second end and having a substantially pure resistance value selected from the range of 1500–2200 ohms, said first end being connected to said second filter element; and
   (d) gain stage means having an input connected to said second lead of said second resistor for amplifying an input signal from said second lead an amount greater than 20 dB, said gain stage means having an input impedance which is substantially a pure resistance and which has a value substantially less than the value of said second resistor, and said gain stage means having an output impedance which is substantially a pure resistance and which has a value substantially equal to or greater than the value of the first resistor.

10. A band-pass filter and gain stage as recited in claim 9 wherein said values of said first and second resistors are approximately equal.

11. A band-pass filter and gain stage for producing a desired passband response at a preselected center frequency, said band-pass filter and gain stage comprising:
    (a) a monolithic filter having a first filter element and a second filter element, said first and second filter elements each employing a piezoelectric ceramic material and being connected together to have a common ground, the resonant frequency of said first filter element and the resonant frequency of said second filter element being selected to be on opposite sides but separated an approximately equal amount from said preselected center frequency, the frequency difference between said resonant frequency of said first filter element and said resonant frequency of said second filter element substantially defining said desired passband response;
    (b) a first resistor having a first end and a second end and having a substantially pure resistance value selected from the range of 200–1000 ohms, said first end being connected to said first filter element;
    (c) a second resistor having a first end and a second end and having a substantially pure resistance value selected from the range of 200–1000 ohms, said first end being connected to said second filter element; and
    (d) gain stage means having an input connected to said second lead of said second resistor for amplifying an input signal from said second lead an amount greater than 20 dB, said gain stage means having an input impedance which is substantially a pure resistance and which has a value substantially equal to or greater than the value of said first resistor.

12. A band-pass filter and gain stage as recited in claim 11 wherein said values of said first and second resistors are approximately equal.

13. A band-pass filter for passing a predetermined band of signals, which comprises:
   (a) a monolithic filter for receiving said signals and having first and second elements connected to have a common ground;
   (b) means for substantially attenuating said input signals passing through said filter including first and second resistors connected respectively in series with said first and second filter elements, said resistors having substantially pure resistance values; and
   (c) means connected to receive the output from said filter for amplifying the substantially attenuated signals.

14. The band-pass filter of claim 13 wherein said amplifying means has an input impedance which is substantially a pure resistance.

15. The band-pass filter of claim 13 wherein said amplifying means has an input impedance having a value substantially less than the value of said second resistor.

16. The band-pass filter of claim 13 wherein said amplifying means has an input impedance which is substantially a pure resistance and which has a value substantially less than the value of said second resistor.

17. A band-pass filter for passing signals having frequencies within a desired passband response, which comprises:
   (a) monolithic filter means having first and second elements connected to have a common ground, the resonant frequency of said first filter element and the resonant frequency of said second fiter element being selected to be on opposite sides but separated a substantially equal amount from a preselected center frequency of said desired passband response;
   (b) first means for attenuating substantially said signals having frequencies within said desired passband response, said first means connected to provide said signals to said first filter element;
   (c) means for amplifying signals having frequencies within said desired passband response; and
   (d) second means for attenuating substantially said signals having frequencies within said desired passband response, said second means connected to provide said signals from said second filter element to said means for amplifying signals.

18. The band-pass filter of claim 17 wherein said amplifying means has an input impedance which is substantially a pure resistance.

19. The band-pass filter of claim 17 wherein said gain stage means has an input impedance which has a value substantially less than the value of said second means.

20. The band-pass filter of claim 17 wherein said amplifying means has an input impedance which is substantially a pure resistance and which has a value substantially less than the value of said second means.

21. Apparatus comprising:
   (a) a monolithic filter having a first filter element and a second filter element, said first and second filter elements being connected to have a common ground;
   (b) a first resistor having a first end and a second end and having a substantially pure resistance value selected from the range of 200–2200 ohms, said first end being connected to said first filter element;
   (c) a second resistor having a first end and a second end and having a substantially pure resistance value selected from the range of 200–2200 ohms, said first end being connected to said second filter element; and
   (d) gain stage means having an input connected to said second end of said second resistor for amplifying an input signal from said second end an amount greater than 20 dB, said gain stage means having an input impedance which is substantially a pure resistance and having a value substantially less than the value of said second resistor.

22. Apparatus as recited in claim 21 wherein said gain stage means has an output impedance which is substantially a pure resistance and which has a value greater than or equal to the value of said first resistor.

23. Apparatus as recited in claim 21 wherein said values of said first and second resistors are approximately equal.

24. Apparatus as recited in claim 21 wherein at least one of said first and second elements of said monolithic filter employs a piezoelectric quartz crystal material.

25. Apparatus as recited in claim 21 wherein at least one said first and second filter elements of said monolithic filter employs a piezoelectric ceramic material.

26. Apparatus as recited in claim 21 for producing a desired passband response at a preselected center frequency, wherein the resonant frequency of said first filter element and the resonant frequency of said second filter element are selected to be substantially on opposite sides but separated an equal amount from said preselected center frequency.

27. Apparatus as recited in claim 26 wherein the frequency difference between said resonant frequency of said first filter element and said resonant frequency of said second filter element substantially defines said desired passband response.

* * * * *